United States Patent
Ramm et al.

(10) Patent No.: US 11,655,544 B2
(45) Date of Patent: May 23, 2023

(54) PVD BARRIER COATING FOR SUPERALLOY SUBSTRATES

(71) Applicant: Oerlikon Surface Solutions AG, Pfäffikon (CH)

(72) Inventors: Jürgen Ramm, Maienfeld (CH); Beno Widrig, Bad Ragaz (CH); Malko Gindrat, Chur (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 17/284,635

(22) PCT Filed: Oct. 16, 2019

(86) PCT No.: PCT/EP2019/078091
§ 371 (c)(1),
(2) Date: Apr. 12, 2021

(87) PCT Pub. No.: WO2020/079084
PCT Pub. Date: Apr. 23, 2020

(65) Prior Publication Data
US 2021/0395897 A1    Dec. 23, 2021

Related U.S. Application Data (60) Provisional application No. 62/746,732, filed on Oct. 17, 2018.

(51) Int. Cl.
*C22C 19/05* (2006.01)
*C22C 19/07* (2006.01)
(Continued)

(52) U.S. Cl.
CPC ........ *C23C 28/3455* (2013.01); *C22C 19/056* (2013.01); *C22C 19/07* (2013.01);
(Continued)

(58) Field of Classification Search
CPC ................... C22C 19/056; C22C 19/07; Y10T 428/12639
(Continued)

(56) References Cited

U.S. PATENT DOCUMENTS

| | | |
|---|---|---|
| 5,902,638 A | 5/1999 | Vakil |
| 6,416,882 B1 | 7/2002 | Beele et al. |

(Continued)

FOREIGN PATENT DOCUMENTS

| | | |
|---|---|---|
| CN | 107574415 A | 1/2018 |
| EP | 0933448 A1 | 8/1999 |

(Continued)

OTHER PUBLICATIONS

TMS, "Composition of Typical Cast Superalloys", Jul. 12, 2017, TMS, URL: <https://web.archive.org/web/20170712145953/https://www.tms.org/communities/ftattachments/superalloystable_castcomp.pdf>, entire document (Year: 2017).*

(Continued)

*Primary Examiner* — Humera N. Sheikh
*Assistant Examiner* — Katherine A Christy
(74) *Attorney, Agent, or Firm* — Michael J. Blessent; Bret E. Field; Bozicevic, Field & Francis LLP (57) ABSTRACT

A layered stack that can be used as an oxidation and chemical barrier with superalloy substrates, including Ni, Ni—Co, Co, and Ni-aluminide based substrates, and methods of preparing the layered stack. The layer system can be applied to a substrate in a single physical vapor deposition process with no interruption of vacuum conditions.

8 Claims, 10 Drawing Sheets

(51) Int. Cl.
  *C23C 28/00* (2006.01)
  *C23C 14/08* (2006.01)
  *C23C 14/16* (2006.01)
  *C23C 14/32* (2006.01)
  *F01D 5/28* (2006.01)

(52) U.S. Cl.
  CPC ............ *C23C 14/081* (2013.01); *C23C 14/16* (2013.01); *C23C 14/325* (2013.01); *C23C 28/321* (2013.01); *F01D 5/288* (2013.01); *Y10T 428/12458* (2015.01); *Y10T 428/12639* (2015.01)

(58) Field of Classification Search
  USPC ......................................................... 428/610
  See application file for complete search history.

(56) References Cited

U.S. PATENT DOCUMENTS

| | | |
|---|---|---|
| 7,364,801 B1 | 4/2008 | Hazel et al. |
| 7,569,251 B2 | 8/2009 | Saint-Ramond et al. |

FOREIGN PATENT DOCUMENTS

| | | |
|---|---|---|
| EP | 1063213 A1 | 12/2000 |
| EP | 0933448 B1 | 4/2004 |
| RU | 2165478 C2 | 4/2001 |
| RU | 2355891 C2 | 5/2009 |
| WO | WO9634129 A1 | 10/1996 |

OTHER PUBLICATIONS

International Preliminary Report on Patentability for PCT Application No. PCT/EP2019/078091 dated Apr. 14, 2021, 6 pages.
Monceau et al., "Pt-modified Ni aluminides, MCrAlY-base multilayer coatings and TBC systems fabricated by Spark Plasma Sintering for the protection of Ni-base superalloys.", Surface and Coatings Technology, vol. 204, Issues 6-7, pp. 771-778, Dec. 25, 2009.
Office Action for European Application No. 19789954.5 dated Dec. 16, 2022, 4 pages.
Office Action for Russian Application No. 2021110986 dated Nov. 25, 2022, with its English summary, 8 pages.
Office Action for Chinese Application No. 201980068634.1 dated Nov. 18, 2022, with its English summary, 7 pages.

\* cited by examiner

PVD BARRIER COATING FOR SUPERALLOY SUBSTRATES

The present invention relates to a layer stack and methods of preparing the same for use as an oxidation and chemical barrier for superalloy substrates, including Ni, Ni—Co, Co, and Ni-aluminide based substrates. The layer system, which includes a first layer (a substrate-like coating), a second layer (a transition layer), and a third layer (an oxide coating), can be prepared in a single physical vapor deposition process.

STATE OF THE ART

Higher operating temperatures are required to increase the efficiency of land-based and aero turbines. For this purpose, superalloy materials were developed with increased creep resistance at higher temperatures. Superalloy materials are based on Fe, Ni, or Co and include additional elements, such as Cr, W, Mo, Ta, Nb, Ti, Al, Zr, Re, Y, V, C, B, Hf, Si, Mn or a combination thereof, to provide desired properties. Higher operating temperatures, however, require increased surface stability of the components with respect to oxidation and corrosion. This is difficult to achieve with existing superalloy materials. Consequently, protective coatings that include two or more layers are applied to the surface of the superalloy materials. Currently these coatings form an adherent and stable interface on the substrate by diffusion processes at elevated temperatures and create a protective oxide at the substrate surface or at the layer adjacent to the substrate. The coating provides the diffusing elements that form the adherent interfaces and the protective oxides for the substrate after thermal treatment. The selection of a specific coating depends on many parameters. One parameter is the adaptability of the coating to the superalloy material, which should be protected in the conditions under which the component will be operated, such as high temperature and harsh environment. α-Alumina (α-$Al_2O_3$) is an effective protective material with respect to oxygen and also serves as a barrier for other reactive environment elements. Coatings that form alumina layer at the surface of the superalloy substrate preferably include diffusion aluminide coatings and overlay coatings. In this regard:

Diffusion aluminide coatings can be produced for example by pack cementation or chemical vapor deposition techniques. Aluminum that is applied to the superalloy surface diffuses into the superalloy to form a β-NiAl phase that is the Al reservoir for the formation of a protective α-alumina layer.

MCrAlY (M=Ni, Co, or NiCo) overlay coatings are typically applied by spray technology and form β-NiAl and γ'-$Ni_3Al$ or γ-$Ni_3Al$ phases.

For both coating types, the adhesion of the coating to the superalloy substrate is provided by a high temperature annealing step. The α-$Al_2O_3$ layer that forms at the surface of the coating during this or additional annealing is utilized as an oxidation and/or corrosion barrier.

Figure 1:
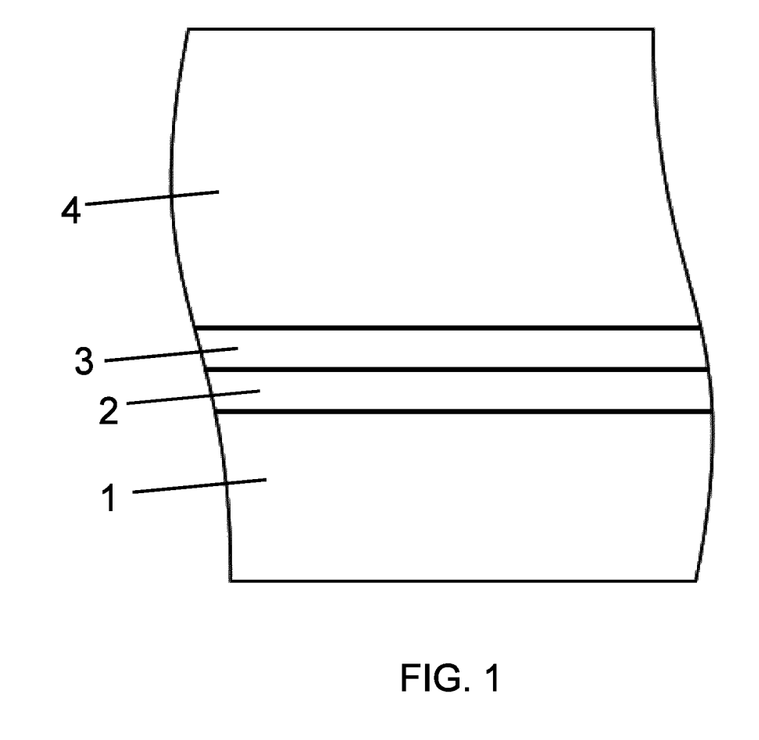
FIG. 1 is a schematic illustrating an MCrAlY overlay coating on a superalloy substrate.

Currently, the MCrAlY overlay coating 2 is often coated with a yttrium-stabilized zirconia layer 4 with porosity of several hundred microns in thickness, as shown in FIG. 1. This type of layer stack (MCrAlY overlay coating 2 and yttrium-stabilized zirconia layer 4 is referred to as a Thermal Barrier Coating, while the MCrAlY overlay coating 2 is referred to as a bond coat because it lies between the superalloy substrate 1 and the yttrium-stabilized zirconia layer 4. The interface between the MCrAlY overlay coating 2 and the yttrium-stabilized zirconia layer 4 is of particular importance because it provides the mechanical stability between the MCrAlY overlay coating 2 and the yttrium-stabilized zirconia layer 4 and serves as a diffusion barrier to protect the MCrAlY overlay coating 2 from oxidation. This is achieved by a thermally-grown oxide 3 at the surface of the MCrAlY overlay coating 2 before the deposition with the yttrium-stabilized zirconia layer 4 and a further stabilization of this thermally-grown oxide 3 by oxygen transport through the yttrium-stabilized zirconia layer 4.

Accordingly, current methods require a MCrAlY overlay coating 2 (with a higher Al content than the superalloy substrate 1) on top of the superalloy substrate 1 in order to provide a reservoir to form a protective α-alumina layer. Because the MCrAlY overlay coating 2 is usually deposited by thermal spray deposition, it may be difficult to achieve low surface roughness for a protective oxide layer. Low surface roughness is advantageous because a typical thermally-grown oxide thickness is in the range of 2 μm.

Further, the annealing process used to form the α-alumina layer depends on the elemental compositions of the superalloy substrate 1 and the MCrAlY overlay coating 2. The additional annealing is required after deposition of the yttrium-stabilized zirconia layer 4.

Additionally, instabilities may occur at the inner surface of the thermally-grown oxide 3 and may result in void formation. And while α-alumina serves as an excellent barrier, it may be advantageous to dope alumina or form an oxide different from alumina as the nucleation layer for the yttrium-stabilized zirconia layer 4 that is difficult with current techniques.

Thus, there is a need to provide an improved method of preparing a superalloy substrate surface with an α-alumina protective coating. There is also a need to provide a stable, thick oxide-based coating at the superalloy substrate without a MCrAlY interface.

OBJECTIVE OF THE PRESENT INVENTION

It is an objective of the present invention to alleviate or overcome one or more difficulties related to the prior art. It has been found that diffusion processes are reduced when the metallic substrate and the substrate-like coating have similar chemical compositions, providing compositional equilibrium between the substrate and the substrate-like coating. The present disclosure is directed to preparing a protective coating on a superalloy substrate that provides the surface for a possible further deposition of the yttrium-stabilized zirconia coating.

DESCRIPTION OF THE PRESENT INVENTION

In a first aspect, disclosed is a multilayered structure. The multilayered structure includes a metallic substrate and a multilayer coating disposed on the metallic substrate. The multilayer coating includes (i) a discrete first layer disposed on the metallic substrate, the first layer including a Ni-, Co-, Ni—Co-, or Ni-aluminide based material; (ii) a second layer disposed on the first layer, the second layer including Al, Cr, O, and further including a Ni-, Co-, Ni—Co, or Ni-aluminide based material; and (iii) a third layer disposed on the second layer, the third layer including Al, Cr, and O.

In an example of the first aspect, the first layer has a chemical composition that is substantially the same as a chemical composition of the metallic substrate.

In another example of the first aspect, the metallic substrate is a Ni-based superalloy comprising 38 to 76 wt. % Ni, up to 27 wt. % Cr, and up to 20 wt % Co.

In another example of the first aspect, a multilayered structure as described in one of the above mentioned examples of the first aspect is disclosed, wherein the discrete first layer comprises 38 to 76 wt. % Ni, up to 27 wt. % Cr, and up to 20 wt. % Co.

In another example of the first aspect, a multilayered structure as described in one of the above mentioned examples of the first aspect is disclosed, wherein the metallic substrate is a Co-based superalloy comprising 35 to 65 wt. % Co, 19 to 30 wt. % Cr, and up to 35 wt. % Ni.

In another example of the first aspect, a multilayered structure as described in one of the above mentioned examples of the first aspect is disclosed, wherein the discrete first layer of the present example comprises 35 to 65 wt. % Co, 19 to 30 wt. % Cr, and up to 35 wt. % Ni.

In another example of the first aspect, a multilayered structure as described in one of the above mentioned examples of the first aspect is disclosed, wherein the metallic substrate is a Ni—Co-based superalloy comprising 40 to 80 wt. % Ni, 9 to 35 wt. % Co, and 10 to 20 wt. % Cr.

In another example of the first aspect, a multilayered structure as described in one of the above mentioned examples of the first aspect is disclosed, wherein the discrete first layer of the present example comprises 40 to 80 wt. % Ni, 9 to 35 wt. % Co, and 10 to 20 wt. % Cr.

In another example of the first aspect, a multilayered structure as described in one of the above mentioned examples of the first aspect is disclosed, wherein the metallic substrate is a Ni-aluminide comprising NiAl, $NiAl_3$, or $Ni_3Al$ with a deviation from nominal composition of ±10 at. %.

In another example of the first aspect, a multilayered structure as described in one of the above mentioned examples of the first aspect is disclosed, wherein the metallic substrate is a single-crystalline Ni-based superalloy comprising 38 to 76 wt. % Ni, up to 27 wt. % Cr, and up to 20 wt. % Co.

In a second aspect, disclosed is a multilayer structure. The multilayer structure includes a metallic substrate and a multilayer coating disposed on the metallic substrate. The multilayer coating includes (i) a discrete first layer disposed on the metallic substrate, the first layer including a Ni-, Co-, Ni—Co-, or Ni-aluminide based material; (ii) a second layer disposed on the first layer, the second layer including Al and O; and (iii) a third layer disposed on the second layer, the third layer including Al, Cr, and O.

In an example of the second aspect, the first layer has a chemical composition that is substantially the same as a chemical composition of the metallic substrate.

In another example of the second aspect, the metallic substrate is a Ni-based superalloy comprising 38 to 76 wt. % Ni, up to 27 wt. % Cr, and up to 20 wt. % Co.

In another example of the second aspect, a multilayered structure as described in one of the above mentioned examples of the second aspect is disclosed, wherein the discrete first layer of the present example comprises 38 to 76 wt. % Ni, up to 27 wt. % Cr, and up to 20 wt. % Co.

In another example of the second aspect, a multilayered structure as described in one of the above mentioned examples of the second aspect is disclosed, wherein the metallic substrate is a Co-based superalloy comprising 35 to 65 wt. % Co, 19 to 30 wt. % Cr, and up to 35 wt. % Ni.

In another example of the second aspect, a multilayered structure as described in one of the above mentioned examples of the second aspect is disclosed, wherein the discrete first layer of the present example comprises 35 to 65 wt. % Co, 19 to 30 wt. % Cr, and up to 35 wt. % Ni.

In another example of the second aspect, a multilayered structure as described in one of the above mentioned examples of the second aspect is disclosed, wherein the metallic substrate is a Ni—Co-based superalloy comprising 40 to 80 wt. % Ni, 9 to 35 wt. % Co, and 10 to 20 wt. % Cr.

In another example of the second aspect, a multilayered structure as described in one of the above mentioned examples of the second aspect is disclosed, wherein the discrete first layer of the present example comprises 40 to 80 wt. % Ni, 9 to 35 wt. % Co, and 10 to 20 wt. % Cr.

In another example of the second aspect, a multilayered structure as described in one of the above mentioned examples of the second aspect is disclosed, wherein the metallic substrate is a Ni-aluminide-based superalloy comprising NiAl, $NiAl_3$, or $Ni_3Al$ with a deviation from nominal composition of ±10 at. %.

In another example of the second aspect, a multilayered structure as described in one of the above mentioned examples of the second aspect is disclosed, wherein the metallic substrate is a single-crystalline Ni-based superalloy comprising 38 to 76 wt. % Ni, up to 27 wt. % Cr, and up to 20 wt. % Co.

In another example of the first or second aspect, a multilayered structure as described in one of the above mentioned examples is disclosed, wherein the second layer has a corundum crystal structure.

In another example of the first or second aspect, a multilayered structure as described in one of the above mentioned examples is disclosed, wherein the third layer has a crystal structure of a solid solution with corundum.

In another example of the first or second aspect, a multilayered structure as described in one of the above mentioned examples is disclosed, wherein a Cr concentration in the third layer decreases in a direction away from the metallic substrate.

In another example of the first or second aspect, a multilayered structure as described in one of the above mentioned examples is disclosed, wherein the first layer has epitaxial growth with respect to the Ni-, Co-, Ni—Co-, or Ni-aluminide based material.

Any one of the above aspects (or examples of those aspects) may be provided alone or in combination with any one or more of the examples of that aspect discussed above; e.g., the first aspect may be provided alone or in combination with any one or more of the examples of the first aspect discussed above; and the second aspect may be provided alone or in combination with any one or more of the examples of the second aspect discussed above; and so-forth.

DETAILED DESCRIPTION

The terminology as set forth herein is for description of the embodiments only and should not be construed as limiting the invention as a whole.

Herein, when a range such as 5-25 (or 5 to 25) is given, this means preferably at least or more than 5 and, separately and independently, preferably not more than 25. In an example, such a range defines independently at least 5, and separately and independently, not more than 25.

The present disclosure describes a new approach for an overlay coating (layer stack) by physical vapor deposition cathodic arc evaporation. In other embodiments, the overlay coating is applied with other physical vapor deposition methods, including sputtering or high-power pulsed sputtering.

Embodiments disclosed herein relate to layer stacks of two components that are deposited on a substrate material by cathodic arc evaporation in a single process (i.e without interruption of vacuum) wherein at least two targets are operated sequentially with a possible simultaneously operation in the transition from the first to the second target. In one or more embodiments, the substrate material is a superalloy substrate, PWA 1483, distributed by Pratt & Whitney. In other embodiments, the substrate is a superalloy material containing a Ni-, Co-, Ni—Co, or Ni-aluminide based material. In one embodiment, the substrate is a Ni-based superalloy material that contains 38 to 76 wt. % Ni, up to 27 wt. % Cr, and up to 20 wt. % Co. In another embodiment, the substrate is a Co-based superalloy material that contains 35 to 65 wt. % Co, 19 to 30 wt. % Cr, and up to 35 wt. % Ni. In another embodiment, the substrate is a Ni—Co-based superalloy material that contains 40 to 80 wt. % Ni, 9 to 35 wt. % Co, and 10 to 20 wt. % Cr. In another embodiment, the substrate is a Ni-aluminide superalloy material that contains NiAl, NiAl$_3$, or Ni$_3$Al with a deviation from nominal composition of ±10 at. %. In one or more embodiments, the substrate is a Ni-based superalloy material and has a chemical composition as shown in Table 1. In Table 1, all values are weight percents. It is to be further understood that a superalloy material need not necessarily draw its entire chemical composition from a single column in Table 1; such a superalloy material may, for example, include one or some component(s) from the "preferred" column below, other component(s) from the "less preferred" column, and still other component(s) from the "still less preferred" column.

TABLE 1

| Element | Most Preferred Wt. % | Preferred Wt. % | Less Preferred Wt. % | Still Less Preferred Wt. % |
|---|---|---|---|---|
| Ni | 38-76 | 35-80 | 30-85 | 25-95 |
| Cr | 0.5-27 | 0.2-30 | 0.1-35 | 0.01-40 |
| Co | 0.5-20 | 0.2-35 | 0.1-50 | 0.01-75 |
| Mo | 1.5-2.3 | 0.5-2.5 | 0.01-4 | 0-5 |
| Fe | 0-0.5 | 0-1 | 0-3 | 0-5 |
| Al | 2.5-3.8 | 0.1-4.5 | 0.01-6 | 0-8 |
| Ti | 3.5-4.9 | 0.1-5.5 | 0.01-6.5 | 0-10 |
| Ta | 4.2-5.5 | 0.1-6.5 | 0.01-8.5 | 0-15 |
| W | 2.5-4.2 | 0.1-5.5 | 0.01-8.5 | 0-10 |
| Zr | 0-0.5 | 0-1 | 0-3 | 0-5 |
| C | 0-.07 | 0.05-0.15 | 0.01-0.25 | 0-0.5 |
| B | 0-0.5 | 0-1 | 0-3 | 0-5 |
| Nb | 0-0.5 | 0-1.5 | 0-2 | 0-5.5 |
| Re | 0-1.5 | 0-3.5 | 0-6.5 | 0-8 |
| Y | 0-0.5 | 0-1.5 | 0-2 | 0-5.5 |
| V | 0-0.5 | 0-1.5 | 0-2 | 0-5.5 |
| Hf | 0-0.5 | 0-1.5 | 0-2 | 0-5.5 |
| Si | 0-0.5 | 0-1.5 | 0-2 | 0-5.5 |
| Mn | 0-0.5 | 0-1.5 | 0-2 | 0-5.5 |

In one or more embodiments, the substrate is a Co-based superalloy material and has a chemical composition as shown in Table 2. In Table 2, all values are weight percents. It is to be further understood that a superalloy material need not necessarily draw its entire chemical composition from a single column in Table 2; such a superalloy material may, for example, include one or some component(s) from the "preferred" column below, other component(s) from the "less preferred" column, and still other component(s) from the "still less preferred" column.

TABLE 2

| Element | Most Preferred Wt. % | Preferred Wt. % | Less Preferred Wt. % | Still Less Preferred Wt. % |
|---|---|---|---|---|
| Ni | 0.5-35 | 0.2-40 | 0.1-55 | 0.01-60 |
| Cr | 19-30 | 15-35 | 10-40 | 5-45 |
| Co | 35-65 | 30-70 | 25-75 | 20-80 |
| Mo | 1.5-2.3 | 0.5-2.5 | 0.01-4 | 0-5 |
| Fe | 0-0.5 | 0-1 | 0-3 | 0-5 |
| Al | 2.5-3.8 | 0.1-4.5 | 0.01-6 | 0-8 |
| Ti | 3.5-4.9 | 0.1-5.5 | 0.01-6.5 | 0-10 |
| Ta | 4.2-5.5 | 0.1-6.5 | 0.01-8.5 | 0-15 |
| W | 2.5-4.2 | 0.1-5.5 | 0.01-8.5 | 0-10 |
| Zr | 0-0.5 | 0-1 | 0-3 | 0-5 |
| C | 0-.07 | 0.05-0.15 | 0.01-0.25 | 0-0.5 |
| B | 0-0.5 | 0-1 | 0-3 | 0-5 |
| Nb | 0-0.5 | 0-1.5 | 0-2 | 0-5.5 |
| Re | 0-1.5 | 0-3.5 | 0-6.5 | 0-8 |
| Y | 0-0.5 | 0-1.5 | 0-2 | 0-5.5 |
| V | 0-0.5 | 0-1.5 | 0-2 | 0-5.5 |
| Hf | 0-0.5 | 0-1.5 | 0-2 | 0-5.5 |
| Si | 0-0.5 | 0-1.5 | 0-2 | 0-5.5 |
| Mn | 0-0.5 | 0-1.5 | 0-2 | 0-5.5 |

In one or more embodiments, the substrate is a Ni—Co-based superalloy material and has a chemical composition as shown in Table 3. In Table 3, all values are weight percents. It is to be further understood that a superalloy material need not necessarily draw its entire chemical composition from a single column in Table 3; such a superalloy material may, for example, include one or some component(s) from the "preferred" column below, other component(s) from the "less preferred" column, and still other component(s) from the "still less preferred" column.

TABLE 3

| Element | Most Preferred Wt. % | Preferred Wt. % | Less Preferred Wt. % | Still Less Preferred Wt. % |
|---|---|---|---|---|
| Ni | 40-80 | 35-85 | 30-90 | 25-95 |
| Cr | 10-20 | 8-25 | 6-30 | 4-35 |
| Co | 9-35 | 7-40 | 5-45 | 3-50 |
| Mo | 1.5-2.3 | 0.5-2.5 | 0.01-4 | 0-5 |
| Fe | 0-0.5 | 0-1 | 0-3 | 0-5 |
| Al | 2.5-3.8 | 0.1-4.5 | 0.01-6 | 0-8 |
| Ti | 3.5-4.9 | 0.1-5.5 | 0.01-6.5 | 0-10 |
| Ta | 4.2-5.5 | 0.1-6.5 | 0.01-8.5 | 0-15 |
| W | 2.5-4.2 | 0.1-5.5 | 0.01-8.5 | 0-10 |
| Zr | 0-0.5 | 0-1 | 0-3 | 0-5 |
| C | 0-.07 | 0.05-0.15 | 0.01-0.25 | 0-0.5 |
| B | 0-0.5 | 0-1 | 0-3 | 0-5 |
| Nb | 0-0.5 | 0-1.5 | 0-2 | 0-5.5 |
| Re | 0-1.5 | 0-3.5 | 0-6.5 | 0-8 |
| Y | 0-0.5 | 0-1.5 | 0-2 | 0-5.5 |
| V | 0-0.5 | 0-1.5 | 0-2 | 0-5.5 |
| Hf | 0-0.5 | 0-1.5 | 0-2 | 0-5.5 |
| Si | 0-0.5 | 0-1.5 | 0-2 | 0-5.5 |
| Mn | 0-0.5 | 0-1.5 | 0-2 | 0-5.5 |

In one or more embodiments, the substrate is a Ni-aluminide superalloy material that contains NiAl, NiAl$_3$, or Ni$_3$Al with a deviation from nominal composition of ±10 at. %.

In one or more embodiments, a discrete first layer of the layer stack is deposited using a first target. For purposes of the present disclosure, "discrete" means "constituting a separate entity; individually distinct." In other words, the first layer is not a part of the underlying substrate. Instead, the discrete first layer is individually distinct and is deposited on the substrate via a physical vapor deposition process.

In one or more embodiments, the chemical composition of the first target is similar or substantially the same as the chemical composition as the substrate. In other words, the first target includes elements in similar ratios as the elements present in the substrate material. However, in some embodiments, the first target, the substrate, or both, may include additional components that are not present in the other and still fall within the scope of the present disclosure. In other embodiments, the chemical composition of the first target is identical to the chemical composition of the substrate.

In one or more embodiments, the first target is prepared from a powder with a chemical composition that is similar to the chemical composition of the superalloy substrate. In this embodiment, the chemical composition of the first target differs by not more than 15 weight percent Ni, Co, or Cr, or that differs by not more than 10 weight percent for Ni-aluminide-based substrates.

In one or more embodiments, a second target containing Al and Cr with a composition of 70 at. % Al and 30 at. % Cr in reactive mode under a constant flow of oxygen gas is used to deposit another layer. In other embodiments, the second target contains 90 to 10 at. % Al and 10 to 90 at. % Cr, preferably 80 to 20 at. % Al and 20 to 80 at. % Cr, more preferably 70 to 30 at. % Al and 30 to 70 at. % Cr, more preferably 60 to 40 at. % Al and 40 to 60 at. % Cr, and more preferably 50 at. % Al and 50 at. % Cr.

In one or more embodiments, the method includes deposition of a first layer with a thickness of approximately 500 nm and an α-(Al$_x$Cr$_y$)$_2$O$_3$ oxide coating with columnar grain structure. In other embodiments, the thickness of the first layer is less than 20 µm, preferably less than 5 µm, and more preferably less than 2 µm. For example, the thickness of the first layer may be 1.5 µm, 1 µm, 900 nm, 800 nm, 700 nm, 600 nm, or 500 nm.

In one or more embodiments, the first layer (substrate-like layer) can be deposited exhibiting a polycrystalline structure. In other embodiments, the first layer exhibits an amorphous structure or a structure showing quasi-epitaxial growth. The deposited structure of the first layer will depend on the substrate being coated as well as on the coating process conditions (e.g. temperature, pressure, etc.) adjusted for deposition. The term "quasi-epitaxial" is used in the context of the present invention for referring to layer structures presenting partially epitaxial growth. For example, it is possible to deposit "quasi-epitaxial" layer structures, which exhibit droplets in the interface with the substrate and exhibit also regions that do not show epitaxy. However, if the transmission electron backscatter diffraction analysis shows epitaxial growth over some regions (in particular over large regions) in the interface between the substrate and the substrate-like layer, then the term "quasi-epitaxy" is used. Sometimes the quasi-epitaxial growth can occur when the substrates do not exhibit single crystalline quality (e.g. orientation).

In one or more embodiments, the method includes deposition of a second layer (a transition region between the first layer and the third layer) with a thickness of approximately 500 nm. In other embodiments, the thickness of the second layer is less than 5 µm, preferably less than 1 µm, and more preferably less than 500 nm. For example, the thickness of the second layer may be 450 nm, 400 nm, 350 nm, 300 nm, or 250 nm.

In one or more embodiments, the method does not include deposition of a second layer. Instead, the method includes deposition of a direct interface between the first layer and the third layer. In embodiments with a second layer, diffusion may improve the adhesion between an α-alumina layer formed during annealing and the third layer and may result in a lower annealing temperature to finalize the diffusion.

In one or more embodiments, the method includes deposition of a third layer (an Al—Cr—O coating) with a thickness of approximately 2 µm. In other embodiments, the thickness of the third layer is greater than 1 µm, preferably greater than 5 µm, and more preferably greater than 10 µm. For example, the thickness of the third layer may be 15 µm, 20 µm, 25 µm, 30 µm or 35 µm.

In one or more embodiments, the deposition process includes a 2-fold substrate rotation with simultaneous operation of the two targets for a period of time. For example, the deposition process can be performed with one-fold or three-fold rotation substrates. In another example, the deposition process can be performed on non-rotating substrates. In embodiments that include substrate rotation, the rotation results in a multilayered structure in the deposited layers.

In one or more embodiments, after deposition of the layer stack on the substrate, the layered substrate is annealed. In one embodiment, the layered substrate is heat treated at 1100° C. for 1 hour in air.

In one or more embodiments, heat treatment causes recrystallization of the first layer (the substrate-like coating). In one embodiment, the first layer shows epitaxial growth on the superalloy single crystal. This indicates a mechanically stable and adherent coating.

In one or more embodiments, the thickness of each layer of the layer stack remained the same and porosity was not observed after heat treatment.

The advantages of the layer stack described in the present disclosure include at least the following: (i) quasi-epitaxial rearrangement in the interface between the first layer (the substrate-like coating) and the substrate; (ii) diffusion between layers can be controlled based for example on the thickness of the second layer (the transition region); (iii) increase of Al concentration by controlled deposition of additional Al directly onto the substrate material or during the deposition of the substrate-like coating or during the deposition of the transition region; (iv) a third layer (Al—Cr—O coating) with a thicknesses in excess of 2 μm in hexagonal structure that provide improved barrier performance; (v) barrier coating with reduced surface roughness.

Figure 2:
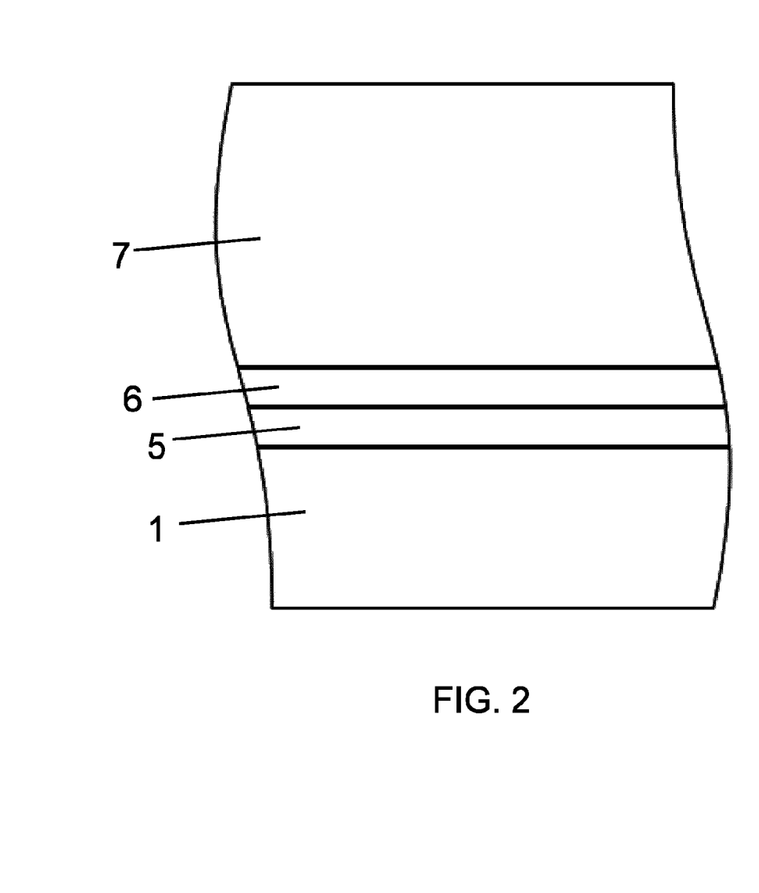
FIG. 2 is a schematic illustrating the layer stack on a superalloy substrate of the present disclosure.
Figure 3:
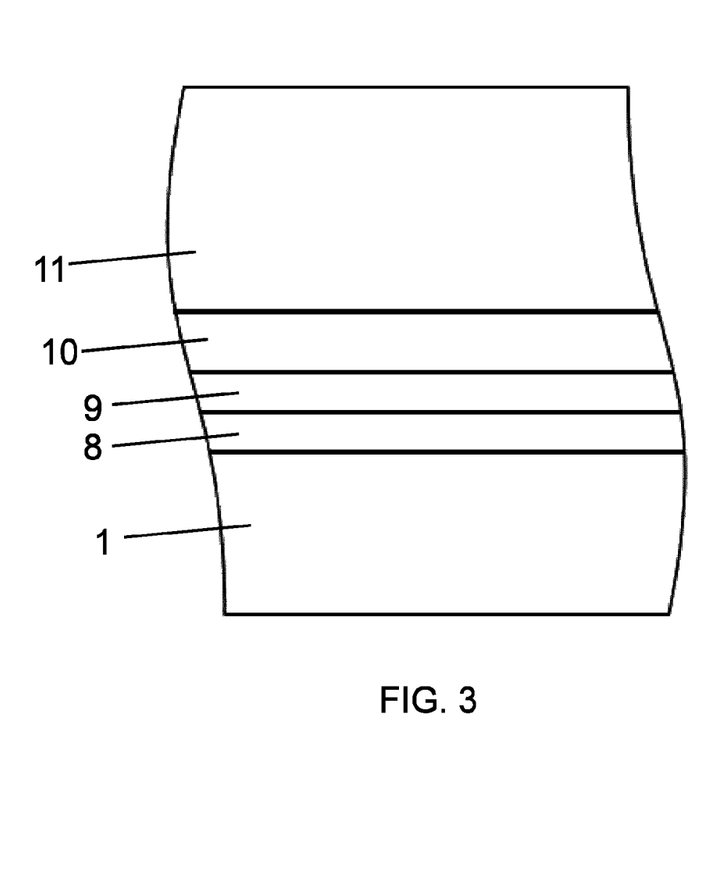
FIG. 3 is a schematic illustrating the layer stack following heat treatment.

For better understanding of the following description, FIG. 2 describes the layer stack deposited by a physical vapor deposition technique in a single process in the as-deposited state. FIG. 3 describes the principle results obtained after annealing the layer stack. In more detail, the present disclosure is related to an oxidation and diffusion barrier that is based upon an overlay coating deposited by physical vapor deposition cathodic arc evaporation. In contrast to standard MCrAlY overlay coatings, the disclosed layer stack is thinner. As shown in FIG. 2, of the layer stack includes a first layer (the substrate-like coating) with a chemical composition that is similar to the superalloy substrate. Subsequently an Al—Cr—O oxide layer that serves as an oxidation barrier is deposited on the first layer. The Al—Cr—O oxide layer replaces the standard thermally-grown oxide for further nucleation and growth. The layer stack is deposited in a single physical vapor deposition process, which means that there is no interruption of vacuum conditions in the transition between applying the substrate-like coating and the Al—Cr—O oxide layer. In previous investigations we showed that quasi-epitaxially growth was achieved for the substrate-like coating on a polycrystalline substrate material. See J. Ast, M. Döbeli, A. Dommann, M. Gindrat, X. Maeder, A. Neels, P. Polcik, M. N. Polyakov, H. Rudigier, K. D. von Allmen, B. Widrig, J. Ramm, Synthesis and characterization of superalloy coatings by cathodic arc evaporation, Surface and Coatings Technology. 327 (2017) 139-145. doi:10.1016/j.surfcoat.2017.07.061. In the present disclosure we have deposited the layer stack on a single-crystalline substrate and analyzed the microstructure of the layer stack as obtained by in-situ processing and after annealing at 1100° C.

The layer stacks of this disclosure are particularly useful as oxidation and chemical barriers for superalloy materials. The results in the present disclosure further demonstrate cathodic arc evaporation for the preparation of oxide layers with barrier properties at high temperatures.

EXAMPLES

The following examples illustrate specific and exemplary embodiments and/or features of the embodiments of the present disclosure. The examples are provided solely for the purposes of illustration and should not be construed as limitations of the present disclosure. Numerous variations over these specific examples are possible without departing from the spirit and scope of the presently disclosed embodiments. That is, the particular ingredients in the compositions, as well as their respective amounts and relative amounts should be understood to apply to the more general content of the Detailed Description.

The deposition of the layer stack was performed with an INNOVA deposition system (Oerlikon Surface Solutions AG, Oerlikon Balzers), which is routinely used to coat tools and components. Non-reactive (i.e. without the addition of gases) as well as reactive (e.g. in pure oxygen atmosphere) cathodic arc evaporation was utilized to prepare the layer stack in a single in-situ process, (i.e. without interruption of vacuum). The example superalloy substrate described herein is a single-crystalline PWA 1483 superalloy with a (001) crystallographic orientation, distributed by Pratt & Whitney. The chemical composition of the PWA 1483 superalloy is provided in Table 4 as described in K. A. Green, M. McLean, S. Olson, and J. J. Schirra, "Evaluation of PWA1483 for Large Single Crystal IGT Blade Applications," Superalloys 2000, The Minerals, Metals & Materials Society, 2000, 295-304. However, the present disclosure is not limited to this superalloy substrate material nor limited to single crystalline material. The layer stack can be applied to other Ni-based superalloy materials to provide similar beneficial results. Accordingly, the PWA1483 is described below as an example only.

TABLE 4

| Element | Ni | Co | Cr | Mo | W | Ta | Ti | Al | C |
|---|---|---|---|---|---|---|---|---|---|
| PWA 1483 Composition [wt. %] | 60.3 | 9.0 | 12.2 | 1.9 | 3.8 | 5.0 | 4.1 | 3.6 | 0.07 |

Transmission electron backscatter diffraction, also called Transmission Kikuchi Diffraction, analyses were performed in a dual FIB FEG-SEM Lyra3 from Tescan, using a Digiview IV EDAX camera, on lift-out specimens with thicknesses of about 100 nm, mounted on a holder with a pre-tilt angle of 20° to the pole piece with 3 mm working distance. Beam conditions were 30 kV and 5 nA. The lift-out lamellae were also analyzed by transmission electron microscopy in a JEOL JEM 2200 fs equipped with an EDAX system for energy dispersive X-ray spectroscopy analysis.

Additional composition analysis was performed by Rutherford backscattering spectrometry with an EN tandem accelerator. The measurements were performed using a 2 MeV, 4He beam and a silicon PIN diode detector under 168°. The collected data were evaluated using the RUMP program.

X-ray diffraction measurements were performed on a Bruker D8 ADVANCE DAVINCI diffractometer (Bruker AXS GmbH) equipped with a Göbel mirror for the generation of a parallel beam and with a LynxEye 1D detector using Cu-Kα radiation. The measurements were carried out in θ/2θ mode between 15° and 120°. For phase analysis, the software DIFFRAC.EVA V4.1 from Bruker was used in combination with the Crystallography Open Database.

Example 1—Preparation of Coated Substrate

A sample superalloy material substrate of PWA 1483 (dimensions of 27 mm×10 mm×3 mm) was cut from a larger piece of bulk superalloy material. The substrate was mechanically and chemically polished and wet-chemically cleaned as known in the state-of the-art in preparation for physical vapor deposition. The substrate was mounted on a two-fold rotating substrate holder. A first target was prepared with powders manufactured by Oerlikon Surface Solutions AG, Oerlikon Metco and had a chemical composition shown in Table 5. The chemical composition of the powder was determined via inductively coupled plasma optical emission spectrometry and inductively coupled plasma mass spectrometry. The chemical composition of the powder composition was substantially similar to the chemical composition of the PWA 1483 superalloy material. The first target was prepared via spark plasma sintering, a process that uses high sintering temperatures under high pressure. The chemical composition of the first target was confirmed by energy dispersive X-ray spectroscopy and is shown in Table 5. The chemical composition at the surface of the first target after operation in the non-reactive mode is substantially similar to the chemical composition of the powder utilized for preparation of the first target.

TABLE 5

| Element | Ni | Co | Cr | Mo | W | Ta | Ti | Al | C |
|---|---|---|---|---|---|---|---|---|---|
| Powder Composition [wt. %] | 60.3 | 9.0 | 12.2 | 1.9 | 3.8 | 5.0 | 4.1 | 3.6 | 0.07 |
| First Target Composition [wt. %] | 59.9 | 9.1 | 14.3 | 1.3 | 3.6 | 5.5 | 3.1 | 3.2 | n.a. |

The second target has a chemical composition of 70 at. % Al and 30 at. % Cr (referred to as $Al_{0.7}Cr_{0.3}$) and was prepared from powders using a standard forging process. The first and second targets had diameters of 150 mm. One of each target type was utilized in the deposition process. First, the process chamber was evacuated below 0.02 Pa and standard heating and etching steps were performed on the substrate to provide sufficient coating adhesion. Next, the substrate was placed in the process chamber and the temperature in the process chamber was increased. The deposition started after the substrate reached a temperature of 550° C. The first target was operated with an arc current of 180 A and a net deposition time of 12 minutes to prepare the first layer (the substrate-like coating) on the substrate with a thickness of approximately 500 nm in the non-reactive process (metallic vapor only). Subsequently, the second layer (the transition layer to the oxide layer) was deposited on the first layer via the following steps during a net deposition time of 1.5 minutes. First, the second target (the $Al_{0.7}Cr_{0.3}$ target) was ignited with an arc current of 180 A while still operating the first target (both in non-reactive mode). Then, an oxygen flow of 400 standard cubic centimeters per minute was initiated. Finally, the first target was turned off. This sequence results in a second layer (the transition layer) with a thickness of approximately 100 nm. Finally, the third layer was deposited by continued operation of the second target during a net deposition time of 120 minutes. During this step, a symmetric bipolar bias voltage of 40 V with a frequency of 25 kHz and a negative pulse length of 36 μs and 4 μs positive pulse length was applied to the substrate during processing in oxygen. This resulted in a third layer (the Al—Cr—O layer) with a thickness of approximately 3.5 μm.

Example 2—Annealing of Coated Substrate

Following preparation of the coated substrate, heat treatment was conducted in ambient atmosphere to test the thermal stability of the layer stack and of the interface between the substrate and the discrete first layer (the substrate-like coating). The coated substrate was annealed at 1100° C. with a heating rate of 10° C./min. The coated substrate was kept at 1100° C. for one hour. Finally, the coated substrate was cooled to room temperature with a cooling rate of 20° C./min.

Figure 4:
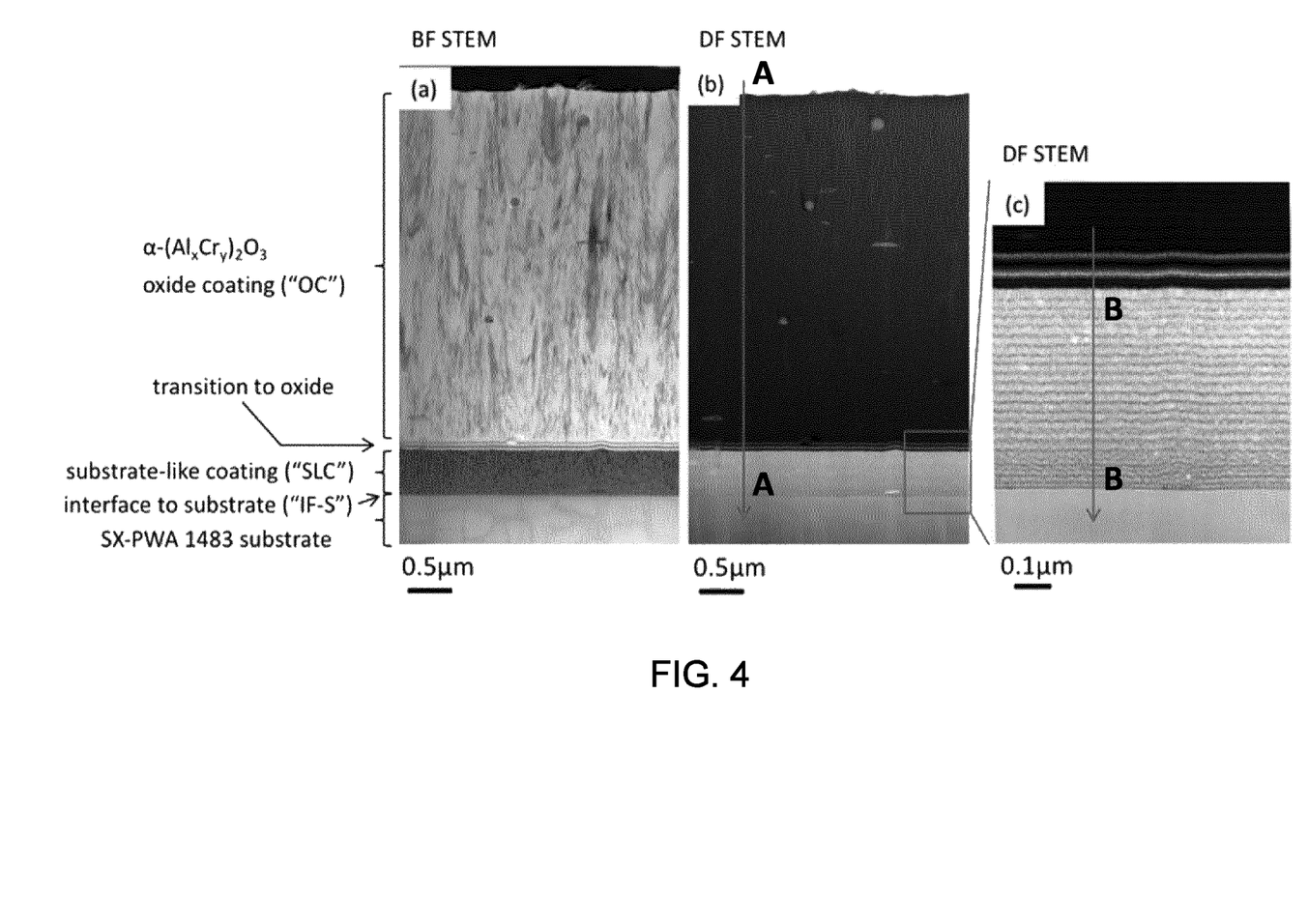
FIGS. 4a-4c are scanning transmission electron microscopy images of the layer stack on the superalloy substrate prior to heat treatment.

FIGS. 4a-4c show scanning transmission electron microscopy images in bright-field (BF) mode (FIG. 4a) and darkfield (DF) mode (FIG. 4b) of a cross-section of the surface region of the coated substrate, including the substrate and the layer stack, following physical vapor deposition by cathodic arc evaporation. The lower portion of FIG. 4a shows the γ/γ' microstructure of the substrate, which is typical for a single-crystalline substrate and can be different for polycrystalline or directional solidified Ni-based superalloys, although the present disclosure applies for all of these types of substrates. An expanded view of the layered structure of the first layer (the substrate-like coating), which can be seen in FIG. 4c, is a result of the 2-fold substrate rotation during deposition. This layered structure will of course be different in other embodiments that include a different speed of substrate rotation or if the substrate is rotated in single rotation or 3-fold rotation. The layered structure will not be seen if the deposition is performed on a non-rotating substrate. The thickness of the first layer (the substrate-like coating) is homogeneous. The transmission electron microscopy indicates small grains on the order of approximately 10 nm and no indication of quasi-epitaxial growth for this region. The layered structure indicates the influence of substrate rotation while the difference in brightness suggests different chemical compositions. It can be recognized that despite the constant conditions of the 2-fold rotation, the thickness of the bilayers in the first layer (the substrate-like coating) increases with time. This is caused by a gettering effect of residual gases in the beginning of evaporation, which corresponds with a reduced evaporation rate. Subsequent to the first layer, the second layer (the transition layer) of about 100 nm is formed by the ignition of the $Al_{0.7}Cr_{0.3}$ target and the addition of oxygen to the arc discharge. After stabilization of the oxygen flow, the first target was turned off. Finally, the operation of the $Al_{0.7}Cr_{0.3}$ target in the oxygen flow of 400 sccm results in the formation of the third layer (the oxide coating). The cross section of this coating, as illustrated in FIG. 4a, shows the presence of columnar grains and small droplets with spherical or flat geometry. These droplet shapes have been ascribed to Cr-rich and Al-rich regions, which act as initiation sites for further grain growth.

Figure 5:
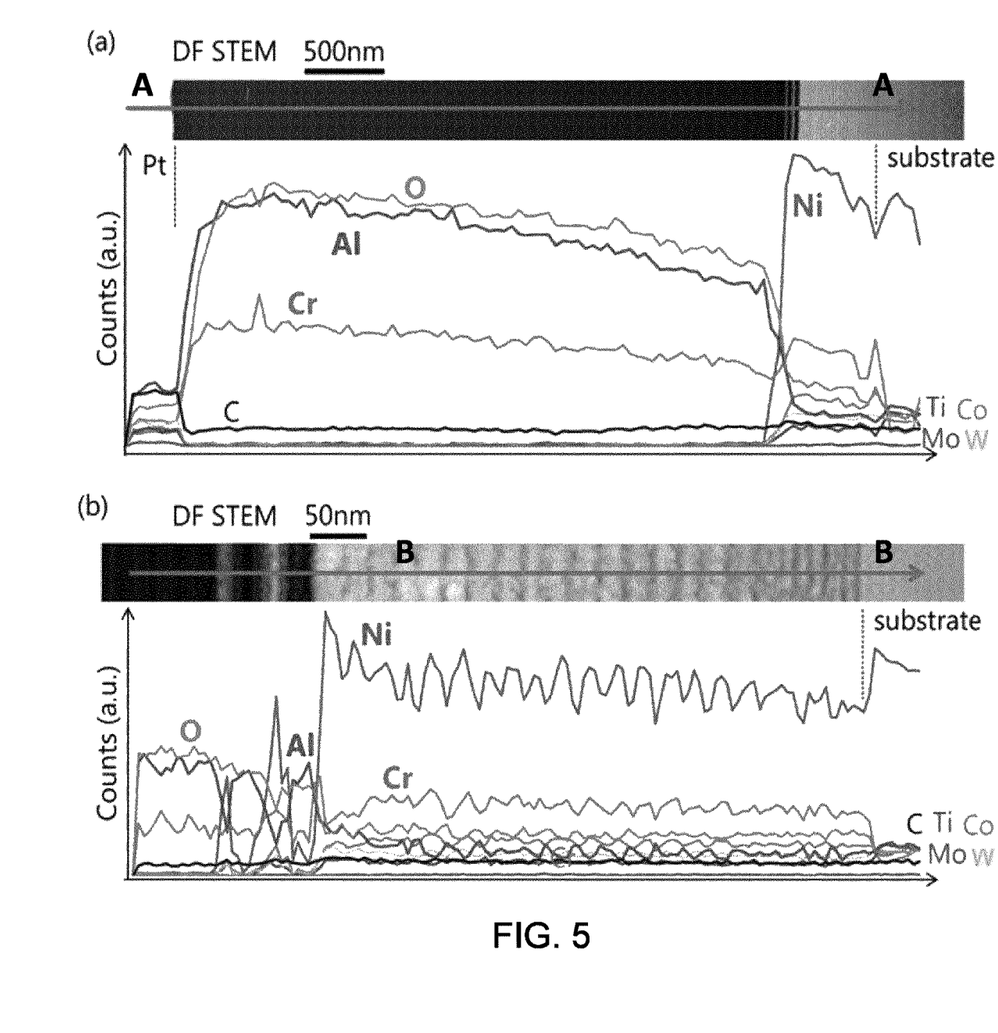
FIGS. 5a and 5b are energy dispersive X-ray spectroscopy line scans of the layer stack on the superalloy substrate prior to heat treatment.

The schematic of the substrate and layer stack as shown in FIG. 2 corresponds with the cross section obtained by transmission electron microscopy in FIGS. 4a-4c. As illustrated in FIG. 2, the layer stack is deposited on the substrate 1. The layer stack includes a first layer 5 (a substrate-like coating), a second layer 6 (a transition layer), and a third layer 7 (an Al—Cr—O coating). The elemental composition of the cross section shown in FIGS. 4a-4c was also analyzed by energy dispersive X-ray spectroscopy in the transmission electron microscopy. FIG. 5a shows the line scan for the width of the layer stack, as shown in FIG. 4b (arrow A-A). There is a clear trend of higher Cr content in the first layer (the substrate-like coating) compared to the substrate. Additionally, there is oxygen in the layered coating and some indication for a slight increase in Co. The third layer (the oxide coating), however, shows no additional elements other than Al, Cr, and O. These measurements suggest that there is a slight Cr and O diffusion from the third layer into the first layer (the substrate-like coating) during deposition. This indicates the importance of controlling the transition between the first layer (the substrate-like coating) and the third layer (the oxide coating) to avoid undesirable reactions. The enlarged energy dispersive X-ray spectroscopy line scan of the first layer (the substrate-like coating, shown in FIG. 4c with arrow B-B) is displayed in FIG. 5b. This line scan supports the hypothesis of oxygen diffusion into the first layer (the substrate-like coating) and suggests a higher Cr content than what is expected from the condensation of the pure first target vapor. There is also an indication that the Ni concentration increases slightly towards the third layer (the oxide coating), which may be caused by an instability in the second layer (the transition region). Due to substrate rotation, regions with high Ni contact and regions with high Al contact are formed in the second layer (the transition region). These differences in concentrations are expected to cause diffusion. However, the reservoir of elements for such diffusion processes is limited.

Figure 6:
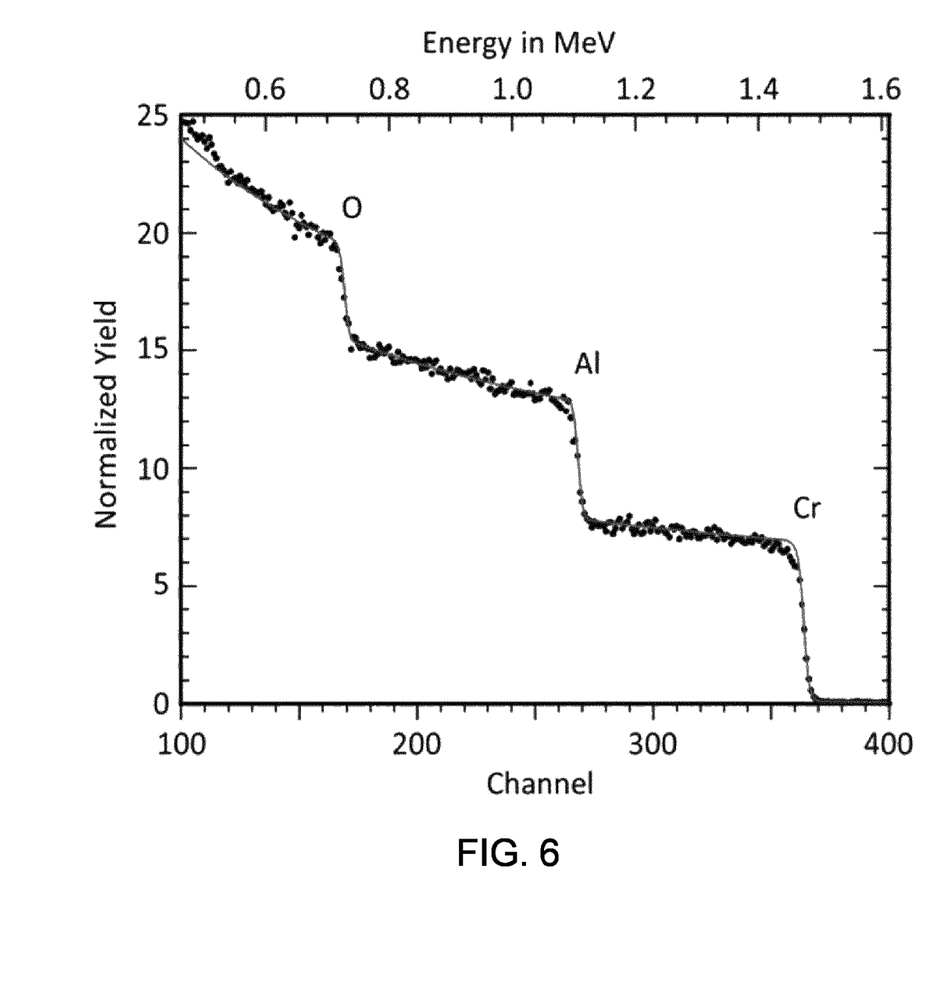
FIG. 6 is a Rutherford backscattering spectrometry spectrum of the layer stack prior to heat treatment.

The energy dispersive X-ray spectroscopy of the second layer (the transition from the first layer (the substrate-like coating) to the third layer (the oxide coating)) shows an increase in Cr and a drop in Al concentration. However, there is neither Ni nor traces of other material from the substrate detectable in the third layer (the oxide coating). It thus appears that the transition to the oxide may cause non-controlled diffusion processes during deposition. However, the Rutherford backscattering spectrometry spectrum with a depth resolution of approximately 500 nm, shown in FIG. 6, does not show an indication of elemental diffusion towards the surface of the third layer (the oxide coating). Except for the Al, Cr, and O signals, no other elements are detected. This suggests a third layer with a $(Al_{0.71}Cr_{0.29})_2O_3$ composition, which corresponds with the ratio Al and Cr in the second target $(Al_{0.7}Cr_{0.3})$ used to prepare the layered coating.

Figure 7:
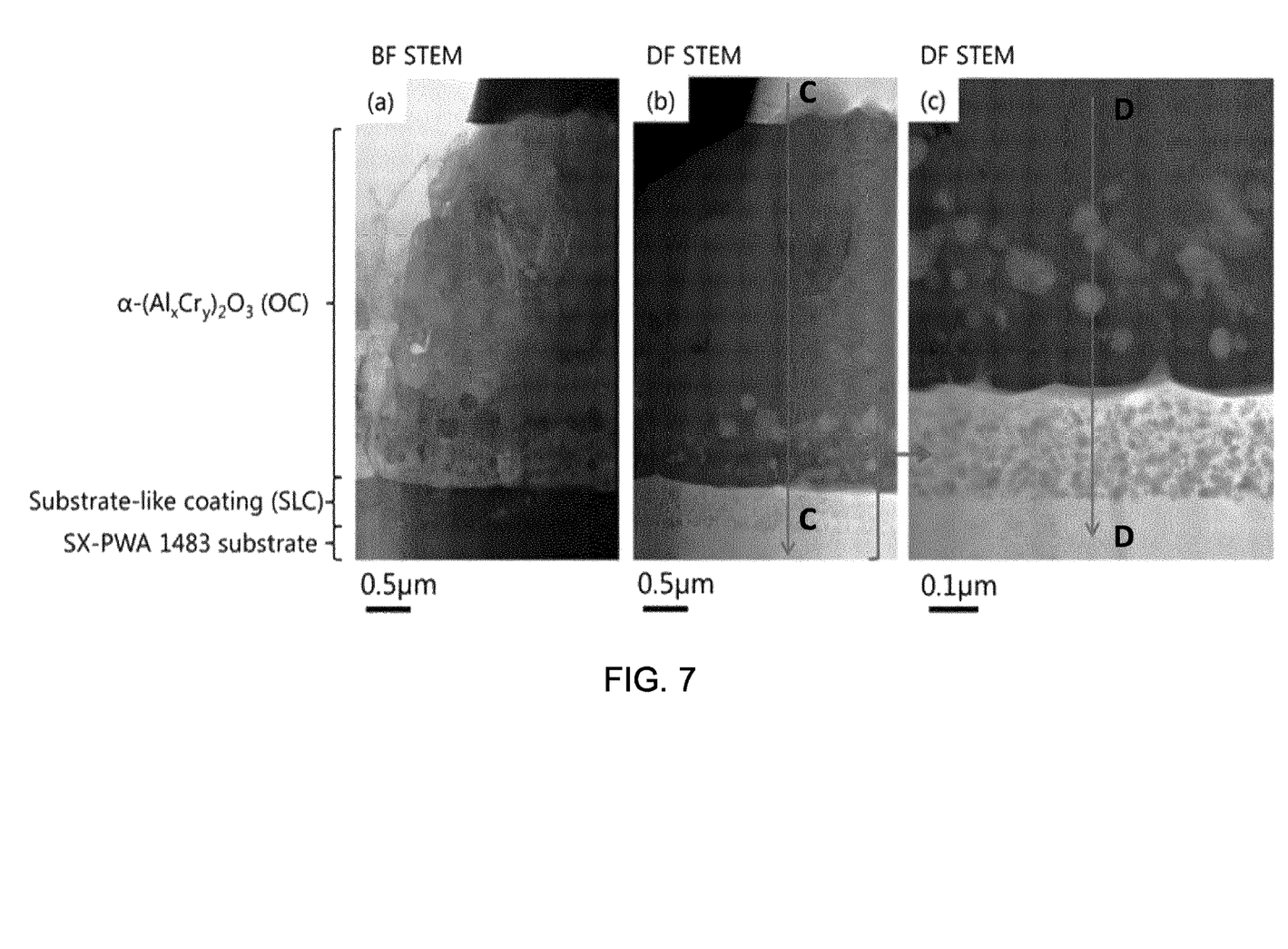
FIGS. 7a-7c are scanning transmission electron microscopy images of the layer stack on the superalloy substrate following heat treatment.

Following deposition of the layered structure on the substrate, the coated substrate was annealed at 1100° C. with a heating rate of 10° C./min, kept for 1 hour at 1100° C., and then cooled to room temperature with a cooling rate of 20° C./min. A schematic of the substrate 1 and layer stack after heat treatment is shown in FIG. 3. Directly on the substrate 1 is a second layer 8 (the recrystallized substrate-like coating), followed by an α-alumina layer 9, an Al—Cr—O layer 10 that includes a reservoir of diffusing elements, and an Al—Cr—O solid solution layer 11. Cross-sectional bright-field mode and dark-field mode analyses, shown in FIGS. 7a and 7b, respectively, illustrate the changes in the microstructure of the layer stack. The nano-layered structure, which was observed prior to annealing, recrystallizes in the entire first layer (the substrate-like coating). In addition, the second layer (the transition region between the substrate-like coating and the oxide coating) is no longer present. The microstructure of the Al—Cr—O coating also changed to include larger grains. The magnified dark-field mode scanning transmission electron microscopy image in FIG. 7c) shows the first layer and a lower part of the third layer in greater detail. The interface between the substrate and the first layer remains distinct and shows a clear change in microstructure. Despite the oxidation and diffusion processes in the layer stack, the thickness of the first layer did not change significantly and porosity was not detected.

Figure 8:
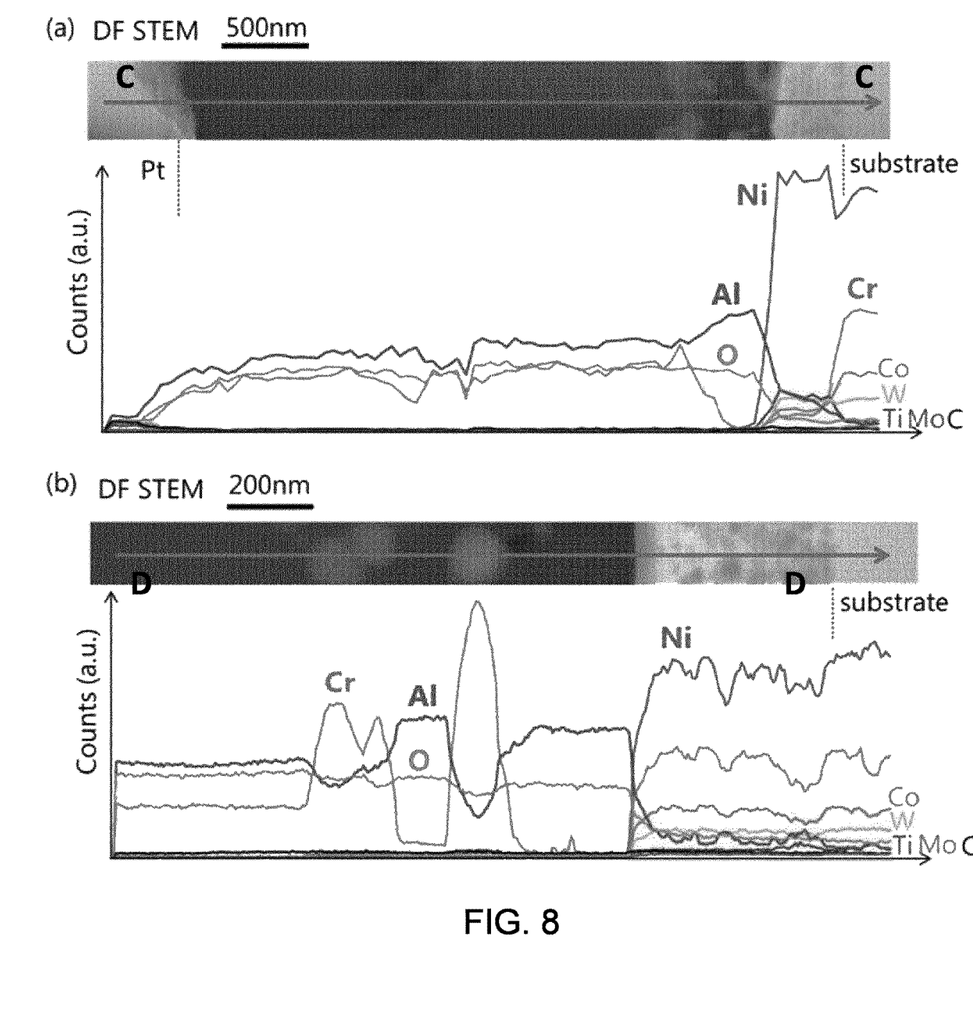
FIGS. 8a and 8b are energy dispersive X-ray spectroscopy line scans of the layer stack on the superalloy substrate following heat treatment.
Figure 9:
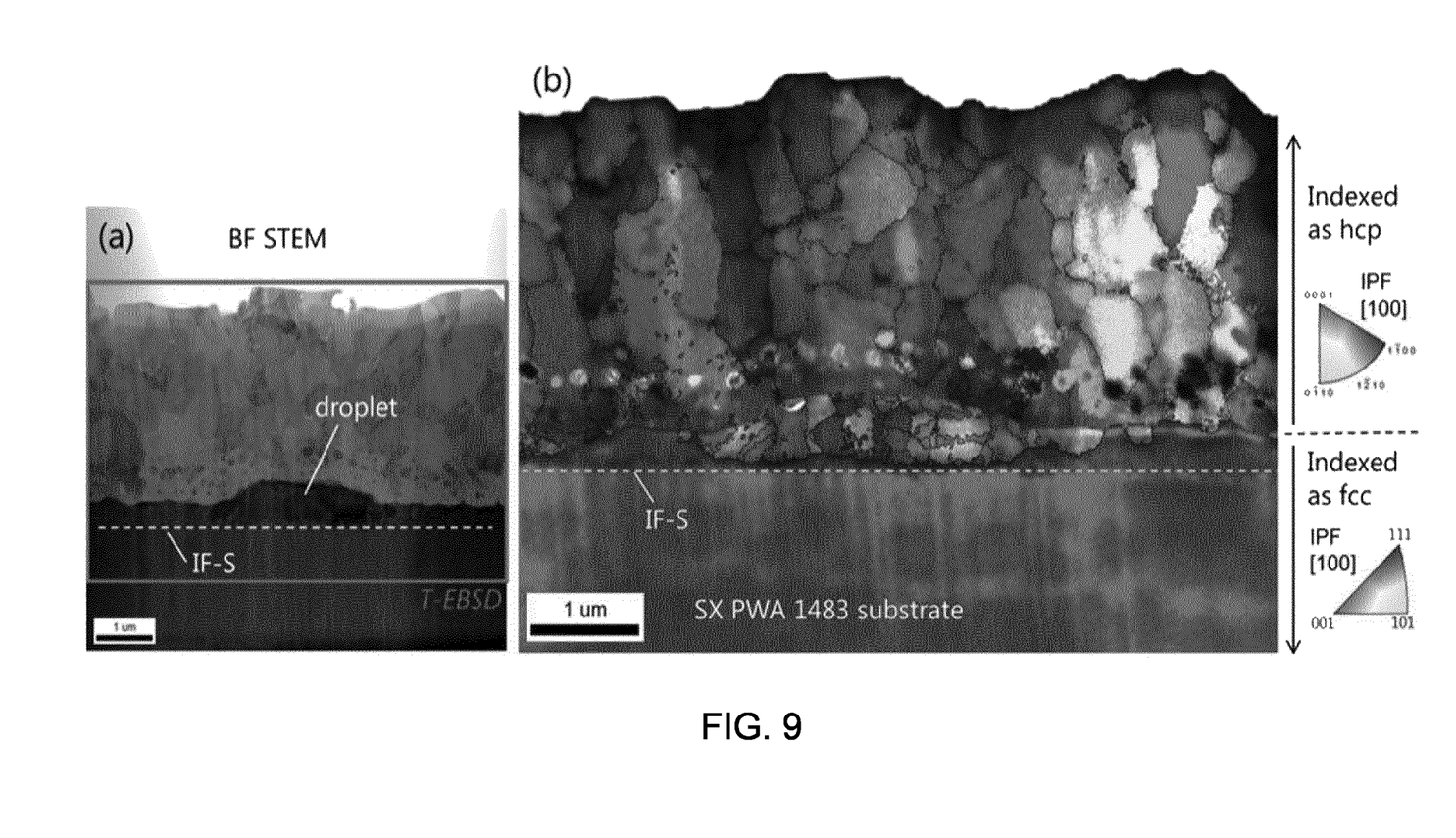
FIGS. 9a and 9b are a scanning transmission electron microscopy image of a cross section of the layer stack on the superalloy substrate following heat treatment and a transmission electron backscatter diffraction measurement of the layer stack on the superalloy substrate following heat treatment, respectively.

Energy dispersive X-ray spectroscopy line scans (FIGS. 8a and 8b) show the change in microstructure following heat treatment. The arrow in FIG. 7b) (arrow C-C) indicates the region displayed in FIG. 8a), which shows a rearrangement of the Al and Cr in the interface between the substrate and the first layer and at the interface to the third layer. The spectrum also indicates a diffusion of Cr and Co into the substrate. Furthermore, there is a depletion of Cr visible at the interface to the oxide and an increase in the Al content. The energy dispersive X-ray spectroscopy line scan also shows a reduction of oxygen in the first layer (the substrate-like coating) when compared to the pre-annealing layer stack. The drop in the interface to the oxide layer is distinct and there is no Ni detectable in the oxide layer. The enlarged energy dispersive X-ray spectroscopy line scan in FIG. 8b) (with reference to the indicated position in FIG. 7c (arrow D-D)) shows additional details about the rearrangement in the interface regions after annealing. An α-alumina region is formed adjacent to the first layer (the recrystallized substrate-like coating). By means of transmission electron backscatter diffraction, shown in FIG. 9, the structure of this α-alumina was identified to be corundum. FIG. 9a is a bright-field mode scanning transmission electron microscopy image of a cross-section of the annealed layer stack. The highlighted rectangle in FIG. 9a indicates the location of the transmission electron backscatter diffraction of FIG. 9b, which shows an overlay of the transmission electron backscatter diffraction pattern quality and crystal orientation maps. The line scan further indicates a region in which the corundum coexists with Cr-enriched oxide phases. On top of this region and towards the surface of the layer stack, a $(Al,Cr)_2O_3$ solid solution with corundum structure was formed (i.e. with the same crystal structure as the α-alumina).

Transmission electron backscatter diffraction measurements, as shown in FIG. 9b, provide a characterization of the layer stack after annealing. In contrast to previous depositions on spark plasma sintered substrate material obtained from powder with chemical compositions similar to PWA 1483, no in-situ epitaxial growth was achieved here prior to heat treatment. This indicates that the polycrystalline surface is more favorable to offer the energetically most favored orientation for nucleation growth according to the crystal structure of the substrate. This favorability may be due to a multitude of crystalline orientations in the polycrystalline surface.

The transmission electron backscatter diffraction analysis performed after the heat treatment confirms that the first layer (the substrate-like coating) and the droplet at the interface to the substrate share the same lattice structure (face-centered cubic, fcc) as expected from the superalloy substrate. The position of the interface to the substrate is indicated by the dashed line in FIGS. 9a and 9b. Additionally, the transmission electron backscatter diffraction analysis confirms that part of the first layer (the substrate-like coating) recrystallizes with the same orientation as the substrate.

As shown in FIGS. 9a and 9b, at the interface to the oxide, $α-Al_2O_3$ with some Cr-enriched phases of globular morphology (but of unknown crystallographic structure (bright contrast in the dark-field mode scanning transmission electron microscopy images)) are formed in a region with a thickness of approximately 600 nm. In addition to the formation of the $α-Al_2O_3$ towards the substrate, the transmission electron backscatter diffraction map also shows the $α-Al_2O_3$ at the interface to the oxide to have the same grain structure (hexagonal close packing, hcp) and orientation as the $α-(Al_xCr_y)_2O_3$ phase on top of the layer stack. The $α-(AlCr)_2O_3$ phase recrystallized into grains with a size of approximately 700 nm.

Figure 10:
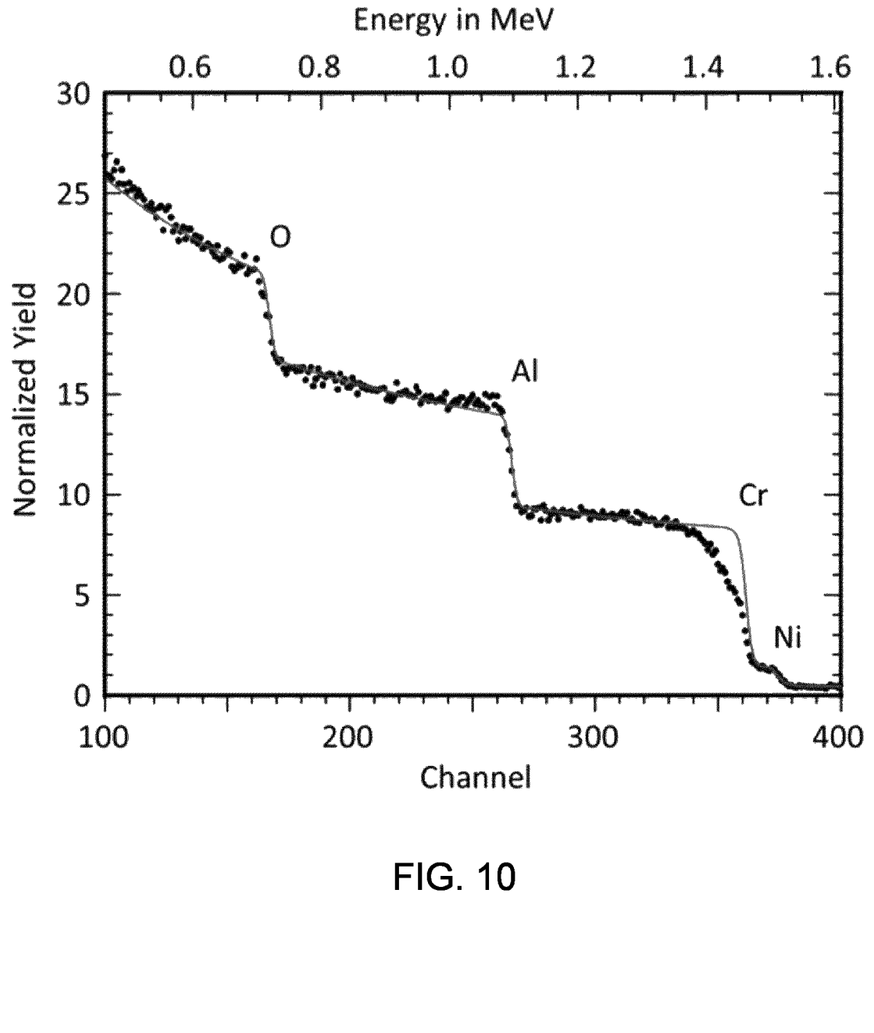
FIG. 10 is a Rutherford backscattering spectrometry spectrum of the layer stack following to heat treatment.

The Rutherford backscattering spectrometry analysis of the surface of the layer stack after annealing, shown in FIG. 10, illustrates differences compared to the layer stack before annealing. In addition to the expected Al, Cr, and O from the Al—Cr—O target, a Ni peak (not distinguishable from Co) equivalent to <1 at. % is visible, indicating that small amounts of Ni diffuse to the surface of the layer stack during annealing. Ni was not detected in the energy dispersive X-ray spectroscopy measurements because of this low concentration. The Rutherford backscattering spectrometry analysis shows depletion of Cr at the surface of the oxide coating and a slight increase in Al.

Figure 11:
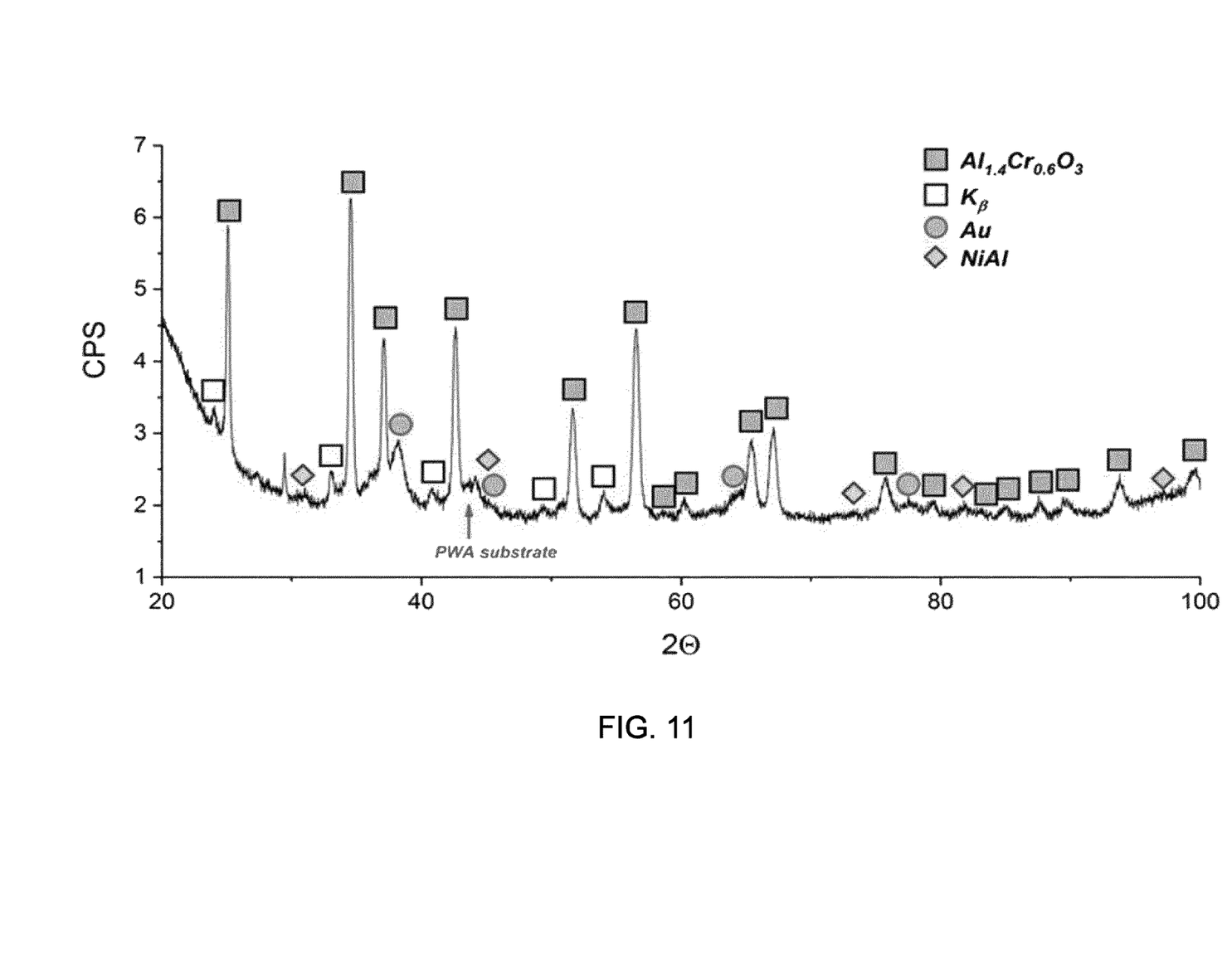
FIG. 11 is a grazing-incidence x-ray diffraction spectrum of the layer stack following heat treatment.

FIG. 11 illustrates a grazing incidence x-ray diffraction measurement of the annealed layer stack. No Ni filter was used to increase the overall intensity. The dominant peaks belong to the corundum structure of the $(Al,Cr)_2O_3$ solid solution. $K_\beta$ peaks are also visible. The presence of gold is explained by the previous focused ion beam scanning electron microscopy analysis, for which the specimen was coated with a thin Au film (few nm) for conductivity purposes. There are also peaks representing the NiAl phase. This shows that Ni diffuses in low amounts to the surface region of the oxide coating and forms the intermetallic compound of the B2 phase NiAl. The results are in agreement with the Rutherford backscattering spectrometry data that shows the presence of Ni, a local increase of Al, and a decrease of Cr.

Due to the formation of corundum, the annealed layer stack can be utilized as oxidation and chemical barrier for superalloy materials. These results demonstrate the potential of cathodic arc evaporation for the preparation of oxides with barrier properties at high temperatures. Further, the protective coating provides a surface for further deposition of a yttrium-stabilized zirconia coating.

All references, including but not limited to patents, patent applications, and non-patent literature are hereby incorporated by reference herein in their entirety.

While various aspects and embodiments of the compositions and methods have been disclosed herein, other aspects and embodiments will be apparent to those skilled in the art. The various aspects and embodiments disclosed herein are for purposes of illustration and are not intended to be limiting, with the true scope and spirit being indicated by the claims.

The invention claimed is:

1. A multilayered structure comprising:
  a. a metallic substrate; and
  b. a multilayer coating disposed on the metallic substrate comprising:
   i. a discrete first layer disposed on the metallic substrate, the discrete first layer comprising a Ni-, Co-, Ni—Co-, or Ni-aluminide based material;
   ii. a discrete second layer disposed on the discrete first layer, the discrete second layer comprising Al, Cr, O, and further comprising a Ni-, Co-, Ni—Co, or Ni-aluminide based material; and
   iii. a discrete third layer disposed on the discrete second layer, the discrete third layer comprising Al, Cr, and O.

2. The multilayered structure according to claim 1, wherein at least the metallic substrate is a Ni-based superalloy comprising 38 to 76 wt. % Ni, up to 27 wt. % Cr, and up to 20 wt. % Co or wherein the metallic substrate is a Co-based superalloy comprising 35 to 65 wt. % Co, 19 to 30 wt. % Cr, and up to 35 wt. % Ni.

3. The multilayered structure according to claim 1, wherein at least the discrete first layer comprises 38 to 76 wt. % Ni, up to 27 wt. % Cr, and up to 20 wt. % Co or wherein the discrete first layer comprises 35 to 65 wt. % Co, 19 to 30 wt. % Cr, and up to 35 wt. % Ni.

4. The multilayered structure according to claim 1, wherein the metallic substrate is a Ni—Co-based superalloy comprising 40 to 80 wt. % Ni, 9 to 35 wt. % Co, and 10 to 20 wt. % Cr.

5. The multilayered structure according to claim 1, wherein the discrete first layer comprises 40 to 80 wt. % Ni, 9 to 35 wt. % Co, and 10 to 20 wt. % Cr.

6. The multilayered structure according to claim 1, wherein the metallic substrate is a Ni-aluminide comprising NiAl, $NiAl_3$, or $Ni_3Al$ with a deviation from nominal composition of ±10 wt. %.

7. The multilayered structure according to claim 1, wherein the metallic substrate is a single-crystalline Ni-based superalloy comprising 38 to 76 wt. % Ni, up to 27 wt. % Cr, and up to 20 wt. % Co.

8. The multilayered structure according to claim 1, the discrete first layer comprising a chemical composition that is the same as a chemical composition of the metallic substrate.

* * * * *